(12) United States Patent
Wu

(10) Patent No.: US 6,255,682 B1
(45) Date of Patent: *Jul. 3, 2001

(54) TRENCH DRAM CELLS WITH SELF-ALIGNED FIELD PLATE

(75) Inventor: Shye-Lin Wu, Hsinchu (TW)

(73) Assignee: Acer Inc., Taipei (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/122,813

(22) Filed: Jul. 27, 1998

(30) Foreign Application Priority Data

Aug. 28, 1997 (TW) ................................. 86112555

(51) Int. Cl.[7] ................................................ H04L 27/108
(52) U.S. Cl. .......................... 257/301; 257/296; 257/301; 257/303; 257/310; 257/411
(58) Field of Search .................................. 257/296, 301, 257/303, 310, 411

(56) References Cited

U.S. PATENT DOCUMENTS

| 5,047,815 | * | 9/1991 | Yasuhira et al. ............... 357/23.6 |
| 5,111,259 | * | 5/1992 | Teng et al. ..................... 357/23.6 |
| 5,317,177 | * | 5/1994 | Naagata et al. ................ 257/301 |
| 5,352,913 | * | 10/1994 | Chung et al. ................... 257/301 |
| 5,369,297 | * | 11/1994 | Kusoniki et al. ............... 257/411 |
| 5,442,584 | * | 8/1995 | Jeong et al. ..................... 365/149 |
| 5,461,248 | * | 10/1995 | Jun ................................... 257/301 |
| 5,488,242 | * | 1/1996 | Sunouchi et al. ............... 257/301 |
| 5,512,767 | * | 4/1996 | Noble, Jr. ......................... 257/301 |
| 5,563,433 | * | 10/1996 | Nagata et al. ................... 257/301 |

FOREIGN PATENT DOCUMENTS

| 004125199 | * | 12/1992 | (JP) ................................ 257/301 |
| 404373159 | * | 12/1992 | (JP) ................................ 257/301 |
| 405021747 | * | 1/1993 | (JP) ................................ 257/301 |

* cited by examiner

Primary Examiner—Eddie C. Lee
Assistant Examiner—Edgardo Ortiz

(57) ABSTRACT

The capacitor includes trenches formed in a semiconductor substrate. Recess portions are formed adjacent to the top portion of the openings of the trenches. An isolation layer is formed on the substrate and on the surface of the recess portions. A first isolation structure is formed on the substrate between the trenches. Second isolation structures are refilled into the recess portions, and the second isolation structures are raised over the isolation layer. A dielectric layer is formed in the trenches along the surface of the trenches. A first storage node is refilled into the trenches. A portion of the first storage node is formed over the first isolation structure to act as a field plate of the capacitor. A third isolation structure is formed on the field plate. The third isolation structure is formed of silicon oxide. A second storage node is formed in the substrate along the surface of the trenches.

13 Claims, 8 Drawing Sheets

TRENCH DRAM CELLS WITH SELF-ALIGNED FIELD PLATE

FIELD OF THE INVENTION

The present invention relates to a semiconductor device, and more specifically, to a structure of a Dynamic Random Access Memory (DRAM) cell. Still more particularly, the present invention relates to a trench DRAM cell with self-aligned field plate.

BACKGROUND

In recent years, the development of semiconductor devices has a trend in the direction of increased packing density on a chip. Thus, the development of a high density memory cell is being carried out. Typically, the DRAM cells are applied to store data for a computer. These semiconductor memory devices have large capacitance for the reading out and storing of information. Dynamic Random Access Memories are so named because their cells can retain information only temporarily, even with power continuously applied. The cells must therefore be read and refreshed at periodic intervals. A memory cell is provided for each bit stored by the DRAM device. Each memory cell typically consists of a storage capacitor and an access transistor. Generally, the formation of a DRAM memory cell includes the formation of a transistor, a capacitor and contacts to external circuits.

In order to achieve high density DRAM devices, the memory cells must be scaled down in size to the sub-micrometer range. This causes reduction in capacitor area, resulting in the reduction of cell capacitance. Therefore, the capacitance of a capacitor becomes relatively small. This decrease in storage capacitance leads to lower signal-to-noise ratios and increased errors due to alpha particle interference. Prior art approaches to overcome these problems have resulted in the development of the trench capacitor. Specifically, the trench capacitor has been given a larger aspect ratio. See "Trench Storage Node Technology for Gigabit DRAM Generations," K. P. Muller et al., 1996, IEEE, IEDM 96-507.

The trench capacitors can upgrade the capacitance and provide better topography. However, some drawbacks are related to the trench capacitors. For example, cell leakage is a serious issue in the making of the trench capacitors. The cell leakage will degrade the retention time of the DRAM cells. The retention time is one of the important parameters of DRAM cells. One of the prior art references related to cell leakage is "Characterization of Cell Leakage of a Stacked Trench Capacitor (STT) Cell," Takeshi Hamamoto et al., 1994 IEEE. The major cause of cell leakage is an etching process that is used to form the field plate of the capacitors. The field plate is damaged by plasma etching, which causes an amount of leakage. See "Trench Capacitor Leakage in High Density DRAM's" M. ELAHY. EDL et al., 1984, IEEE ELECTRON DEVICE LETTERS, vol. EDL. 5, No. 12, pp. 527–530. and "Scalability of a Trench Capacitor Cell for 64M bit DRAM," B. W. Shin et al., 1989, IEEE, IEDM 89-27.

SUMMARY

In accordance with the present invention, a trench capacitor with self-aligned field plate is provided for a DRAM cell. One embodiment adapted for use in a DRAM cell will be described as follows.

The capacitor includes trenches formed in a semiconductor substrate. Recess portions are formed adjacent to the top portion of the openings of the trenches. An isolation layer is formed on the substrate and on the surface of the recess portions. A first isolation structure is formed on the substrate between the trenches. Second isolation structures are refilled into the recess portions, and the second isolation structures are raised over the isolation layer. A dielectric layer is formed in the trenches along the surface of the trenches. A first storage node is refilled into the trenches. A portion of the first storage node is formed over the first isolation structure to act as a field plate of the capacitor. A third isolation structure is formed on the field plate. The third isolation structure is formed of silicon oxide. A second storage node is formed in the substrate along the surface of the trenches.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 14:
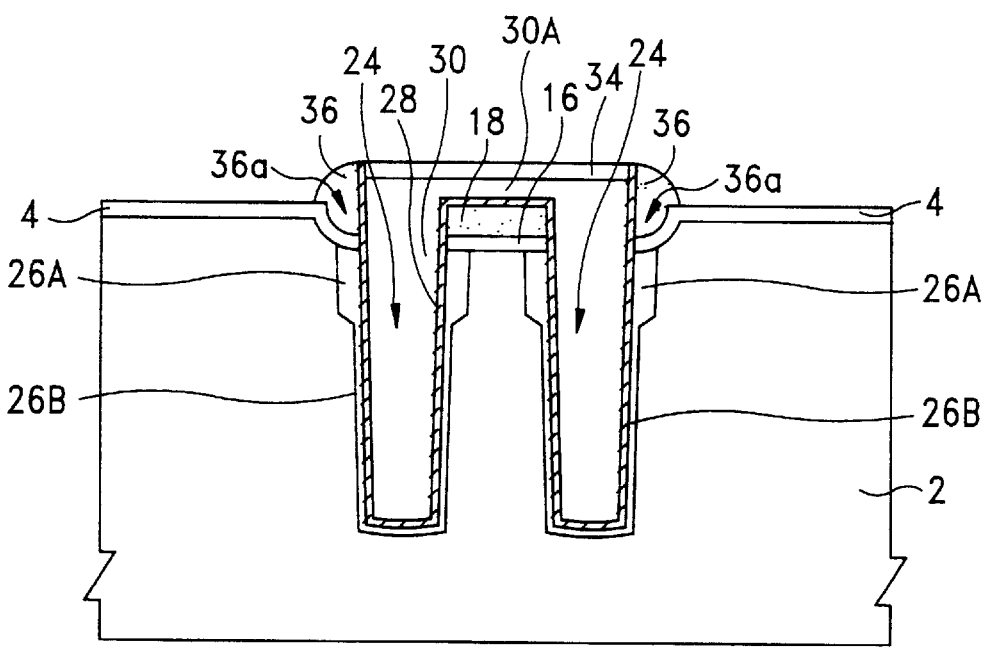
FIG. 14 is a cross-sectional view of a semiconductor wafer illustrating the step of removing a portion of the first silicon nitride layer and the first pad oxide according to the present invention.

In the present invention, a new trench capacitor with self-aligned field plate is disclosed for a DRAM. Turning to FIG. 14, the trench capacitor according to the present invention is illustrated. The capacitor includes trenches 24 formed in a semiconductor substrate 2. Recess portions 36a are formed adjacent to the top portion of the openings of the trenches 24. An isolation layer 4 of silicon oxide is formed on the substrate 2 and on the surface of the recess portions 36a.

A first isolation structure 16, 18 is formed on the substrate 2 between the trenches 24. The first isolation structure includes a silicon oxide layer 16 formed on the substrate 2 and a silicon nitride layer 18 formed thereon. The bottom surface of the first isolation structure 16, 18 is lower than the surface of the substrate 2. Second isolation structures 36 formed of silicon nitride are refilled into the recess portions 36a, and the second isolation structures 36 are raised over the isolation layer 4. A dielectric layer 28 serving as a capacitor dielectric is formed in the trenches 24 along the surface of the trenches 24, the first isolation structure 16, 18, and the surface of the isolation layer 4, second isolation structure 36 that adjacent to the trenches 24.

A first storage node 30 formed of conductive material, such as doped polysilicon or in-situ polysiliocn, is refilled into the trenches 24. The first storage node 30 is also formed between the second isolation structures 36, first isolation structure 16, 18. A portion of the first storage node is formed over the first isolation structure 16, 18 to act as a field plate 30A of the capacitor. A third isolation structure 34 is formed on the field plate 30A. The third isolation structure 34 is formed of silicon oxide. A second storage node 26A, 26B is formed in the substrate 2 along the surface of the trenches 24 and adjacent to the dielectric layer 28. Typically, the second storage node 26A, 26B is formed of doped ions region and by ion implantation.

Figure 1:
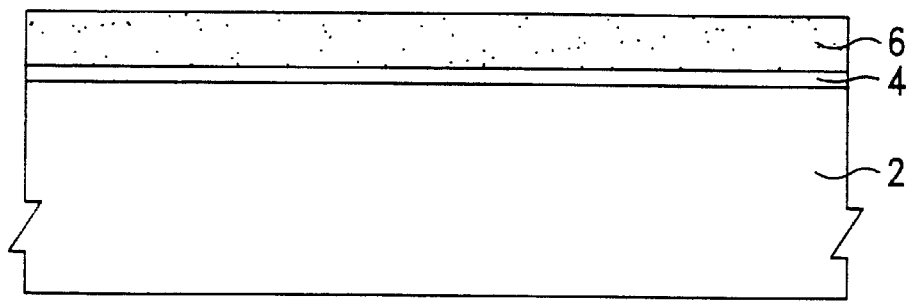
FIG. 1 is a cross-sectional view of a semiconductor wafer illustrating the steps of forming a first pad oxide and a first silicon nitride layer on a substrate according to the present invention.

The formation of the trench DRAM cell includes many process steps that are well known in the art. For example, the processes of lithography masking and etching are used extensively in an embodiment of the present invention. Referring to FIG. 1, a single crystal silicon substrate 2 with a <100> crystallographic orientation is provided. First, a thermal silicon oxide layer 4 of 30 to hundreds angstroms is formed on the substrate 2 to act as a pad layer. The pad oxide is formed to reduce the stress between the substrate 2 and a subsequent silicon nitride layer. The pad oxide layer can also be formed by any suitable chemical vapor deposition. A silicon nitride layer 6 is then formed on the silicon oxide layer 4 to have a thickness approximate 1500–2000 angstroms. The silicon nitride layer 6 can be formed by low pressure chemical vapor deposition, plasma enhanced chemical vapor deposition or high density plasma chemical vapor deposition. The reaction temperature is about 300 to 800 degrees centigrade.

Figure 2:
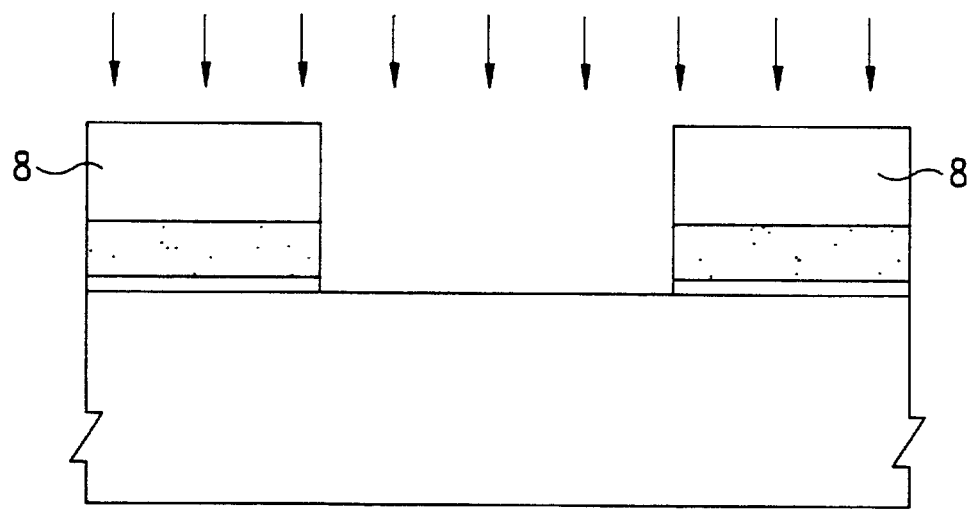
FIG. 2 is a cross-sectional view of a semiconductor wafer illustrating the steps of etching the first pad oxide and the first silicon nitride layer, and performing an ion implantation according to the present invention.

Then, turning to FIG. 2, the silicon oxide 4, the silicon nitride layer 6 are patterned by well known photolithography, leaving an exposed area where the capacitor will be formed in subsequent processes. Thus, a photoresist 8 is patterned on the silicon nitride layer 6 to define a trenches region. Then, an ion implantation is performed using the photoresist 8 as a mask to increase the ion concentration of the exposed area for preventing the trench cell punch through effect. Typically, the ions are p type, such as boron, the implantation energy and the implantation dosage are respectively about 150 KeV to 2MeV, 1E12 to 1E14 atoms/cm$^2$. After the step is completed, the photoresist 8 is removed.

Figure 3:
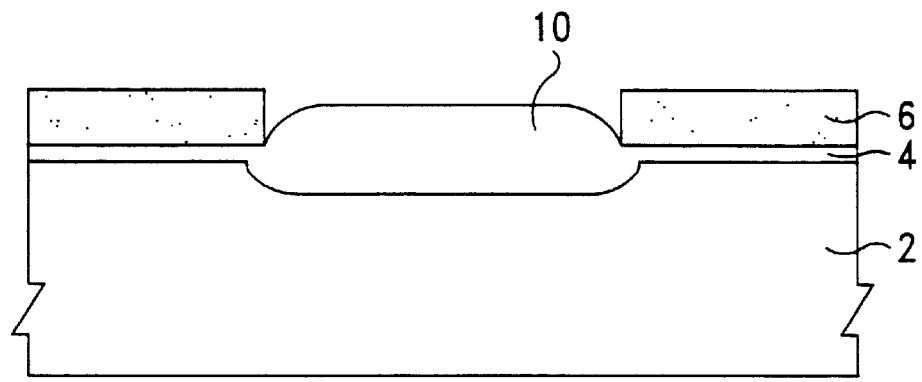
FIG. 3 is a cross-sectional view of a semiconductor wafer illustrating the step of forming a field oxide region according to the present invention.

The next step is to generate a recess portion in the substrate 2. In the preferred embodiment, a field oxide region 10 is formed on the exposed area by thermal oxidation using the first silicon nitride layer 6 as a mask. A portion of the field oxide region 10 extends into the substrate 2, as shown in FIG. 3. The temperature of this step is about 900 to 1200 degrees centigrade. Further, the ions doped by the first ion implantation are driven into deeper portion of the substrate 2 by the thermal process.

Figure 4:
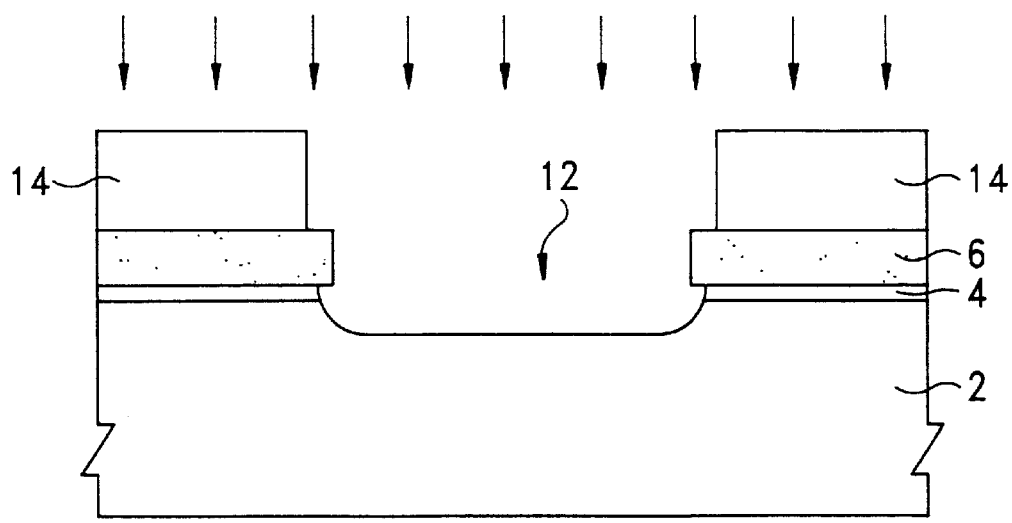
FIG. 4 is a cross-sectional view of a semiconductor wafer illustrating the steps of removing the field oxide region and performing an ion implantation according to the present invention.

Turning to FIG. 4, the field oxide region 10 is removed using the first silicon nitride 6 as a mask to generate the recess portion 12 in the substrate 2. Subsequently, a photoresist 14 is patterned on the first silicon nitride layer 6 to expose the recess portion 12. Then, an ion implantation is performed with low energy to adjust the threshold voltage of the memory cells. The ions used to implant in the area are p type, such as boron or $BF_2$. The energy of the second ion implantation is about 5 to 50 KeV. Further, the dosage of the second ion implantation is about 1E12 to 5E13 atoms/cm$^2$. After the step is completed, the photoresist 14 is removed. If the $BF_2$ is used to replace the boron, then the energy of the second ion implantation is about 20 to 100 KeV.

Figure 5:
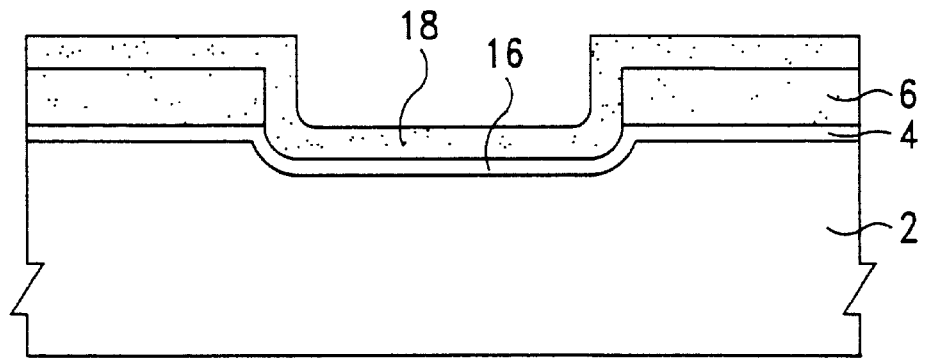
FIG. 5 is a cross-sectional view of a semiconductor wafer illustrating the steps of a second pad oxide and a second silicon nitride layer according to the present invention.

Referring to FIG. 5, a second silicon oxide layer 16 is formed on the surface of the recess portion 12 and on the first silicon nitride layer 6 to serve as a second pad oxide. Further, the second silicon nitride layer 16 is also used for isolation. Similarly, the second pad oxide 16 can be formed using chemical vapor deposition or thermal oxidation. Successively, a second silicon nitride layer 18 is formed on the second silicon oxide layer 16 at a temperature of about 350 to 800 degrees centigrade.

Figure 6:
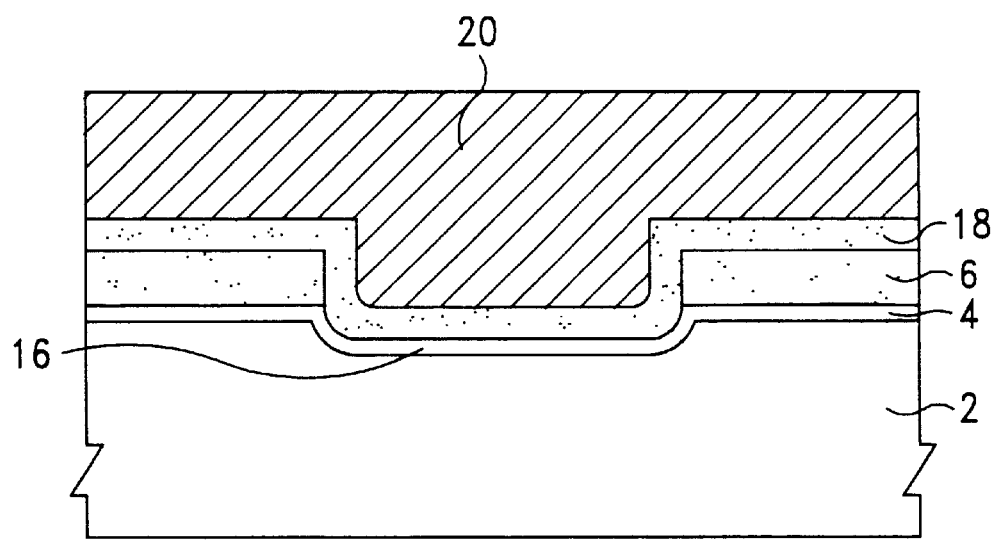
FIG. 6 is a cross-sectional view of a semiconductor wafer illustrating the step of forming a BPSG layer according to the present invention.

Then, a BPSG (borophosphosilicate glass) layer 20 is formed on the second silicon nitride layer 18 and refilled into the recess portion 12 to act as a hard mask for subsequent process. In addition, a spin on glass (SOG) can take place of the BPSG layer 20, as shown in FIG. 6.

Figure 7:
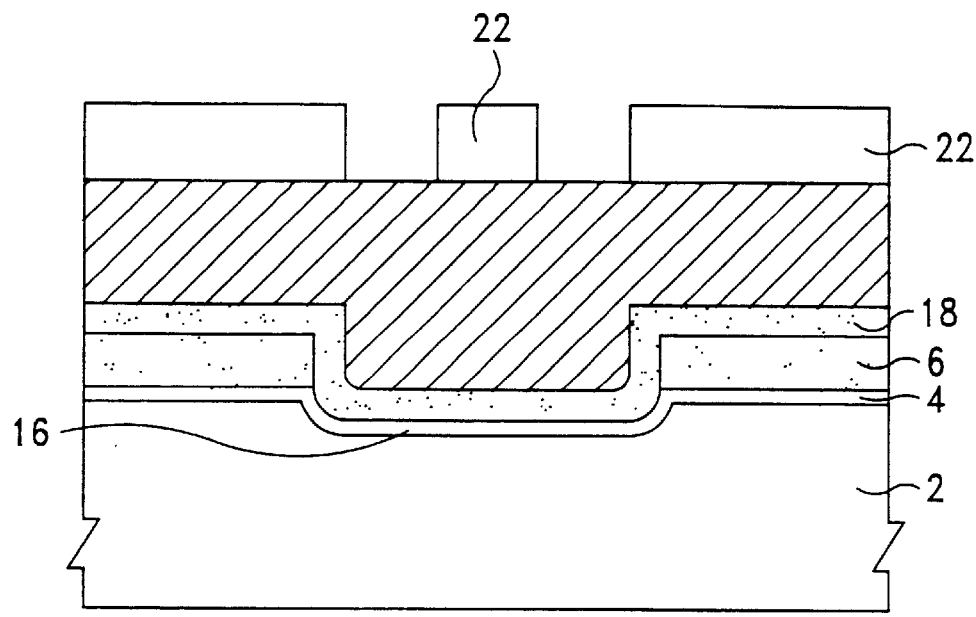
FIG. 7 is a cross-sectional view of a semiconductor wafer illustrating the step of forming a photoresist on the BPSG layer according to the present invention.
Figure 8:
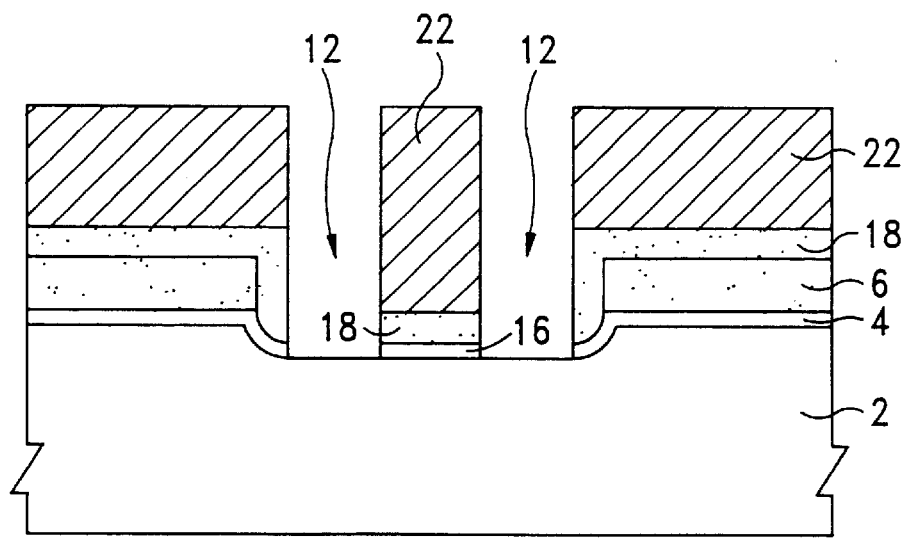
FIG. 8 is a cross-sectional view of a semiconductor wafer illustrating the step of etching the BPSG layer according to the present invention.

A photoresist 22 is then patterned on the BPSG layer 20 to expose portions of the BPSG (borophosphosilicate glass) layer 20. Thus, the area to form trenches is defined by the photoresist 22. Please turn to FIG. 7. The exposed portions are over the recess portion 12. An etching step is next performed to etch the BPSG layer 20, the second silicon nitride layer 18 and the second silicon oxide layer 16 to the surface of the substrate 2. Then, the photoresist 22 is stripped, as shown in FIG. 8.

Figure 9:
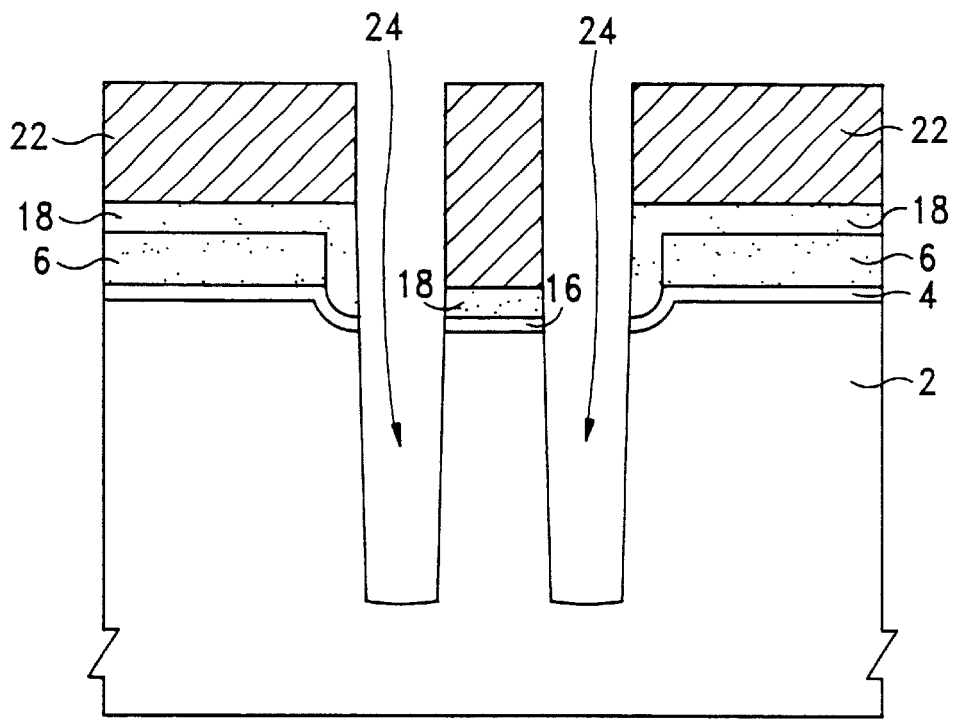
FIG. 9 is a cross-sectional view of a semiconductor wafer illustrating the step of forming trenches in the substrate according to present invention.

Turning to FIG. 9, trenches 24 are then created in the substrate 2 using the BPSG 22 as the hard mask to etch the substrate 2. The etchant can be chosen from the group of $SiCl_4/Cl_2$, $SF_6$, $HBr/O_2$, $BCl_3/Cl_2$, $HBr/Cl_2/O_2$, $Br_2/SF_6$. The trenches 24 are formed using anisotropic etching, such as RIE (reactive ion etch). Next, the BPSG layer 22 is removed.

Figure 10:
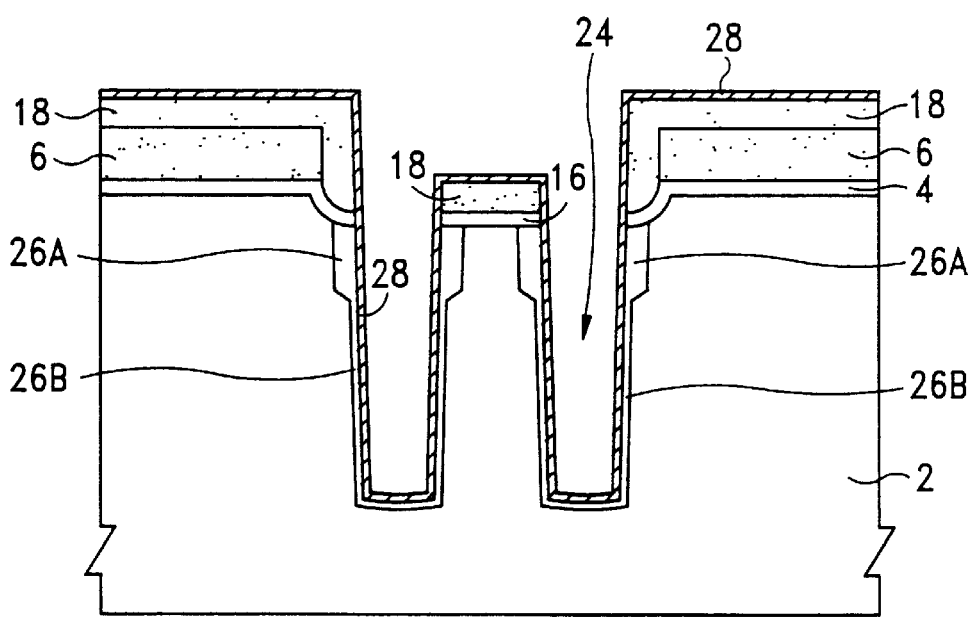
FIG. 10 is a cross-sectional view of a semiconductor wafer illustrating the steps of forming a dielectric film and a first storage node according to of the present invention.

Referring to FIG. 10, ion implantation processes are performed with at least two titled angles with respect to the normal (vertical) line of the substrate 2 to dope n type ions, such as arsenic, into the surface of the trenches. Ion doped areas 26A and ion doped areas 26B surround the surface of the trenches 24 to act as first storage nodes of capacitors and to form the n+/p junctions for memory cell. The ion doped areas 26A are formed with a larger first tilted angle relative to a second tilted angle that is used to form the ion doped areas 26B. The first tilted angle is oblique from the normal line of the substrate 2 about 20 to 45 degrees. The energy of the ion implantation to form the ion doped areas 26A is about 30 to 120 KeV. The dosage of the ion implantation is about 5E14 to 5E16 atoms/cm$^2$. Further, the doped ion areas 26B are formed with an oblique ion implantation with a second tilted angle. The second tilted angle is about 3 to 10 degrees from the normal line of the substrate 2. The energy and the dosage of the ion implantation to form the ion doped areas 26B are respectively about 30 to 120 KeV and about 5E14 to 5E16 atoms/cm$^2$.

A dielectric layer 28 is then conformally deposited along the surface of the trenches 24 and on the surface of the second silicon oxide layer 16, the second silicon nitride layer 18. The dielectric layer 28 can be formed of a silicon nitride/silicon oxide double-film, a silicon oxide/silicon nitride/silicon oxide triple-film, or any other high dielectric film such as tantalum pentoxide ($Ta_2O_5$), BST, PZT.

Figure 11:
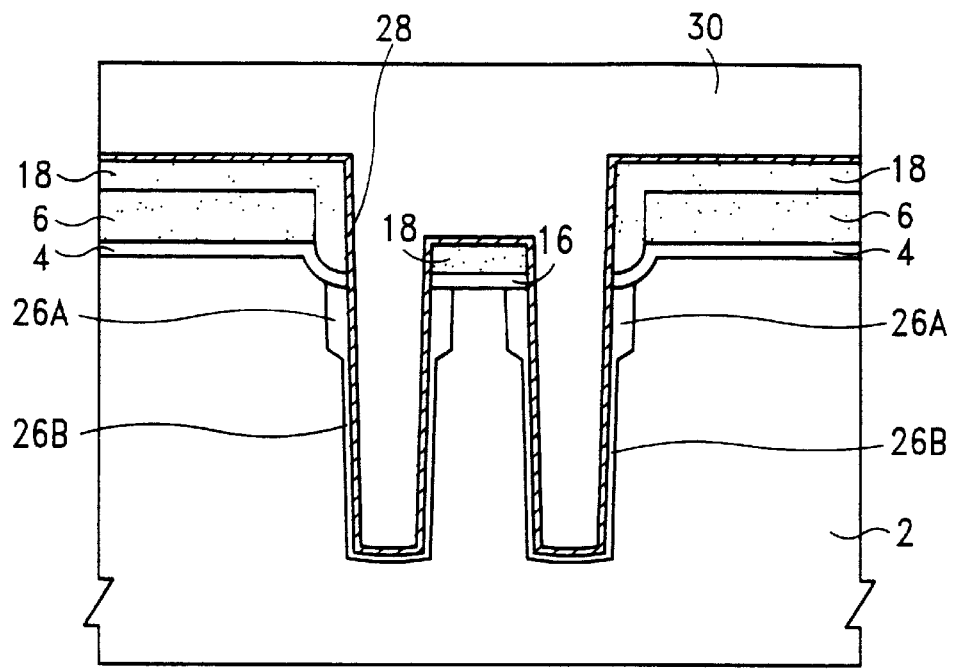
FIG. 11 is a cross-sectional view of a semiconductor wafer illustrating the step of forming a first polysilicon layer according to the present invention.
Figure 12:
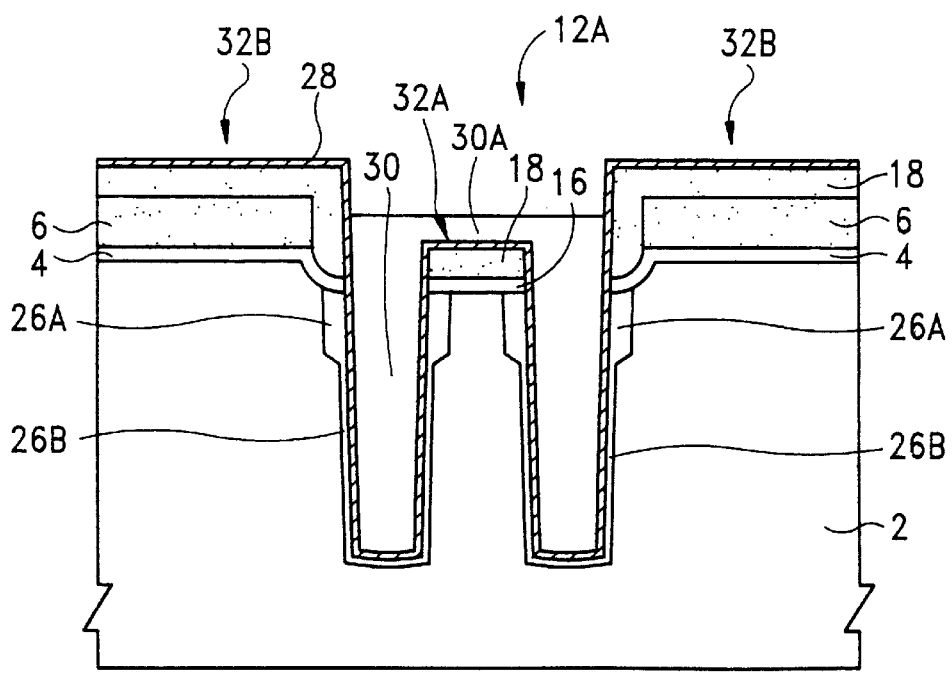
FIG. 12 is a cross-sectional view of a semiconductor wafer illustrating the step of etching the first polysilicon layer according to the present invention.

Afterwards, and referring to FIG. 11, a polysilicon layer 30 is deposited on the dielectric layer 28 and refilled into the trenches 24 using a conventional LPCVD (low pressure chemical vapor deposition) process. Similarly, the polysilicon layer 30 is preferably either doped polysilicon or in-situ doped polysilicon. The thickness of the polysilicon layer 30 is about 5000 to 10000 angstroms. Then an etching back is used to etch the polysilicon layer 30 such that the surface of the polysilicon layer is lower than an opening 12A of the recess portion 12, as shown in FIG. 12. Therefore, a field plate 30A is self-aligned formed on top of the polysilicon layer 30 in the trenches 24 and over the second silicon nitride layer 18. In this step, no mask is used for forming the field plate 330A. The surface of second silicon nitride layer 32A is lower than that of the first silicon nitride layer 18 due to the recess portion 12. Thus, the field plate 330A can be self-aligned formed in the trenches.

Figure 13:
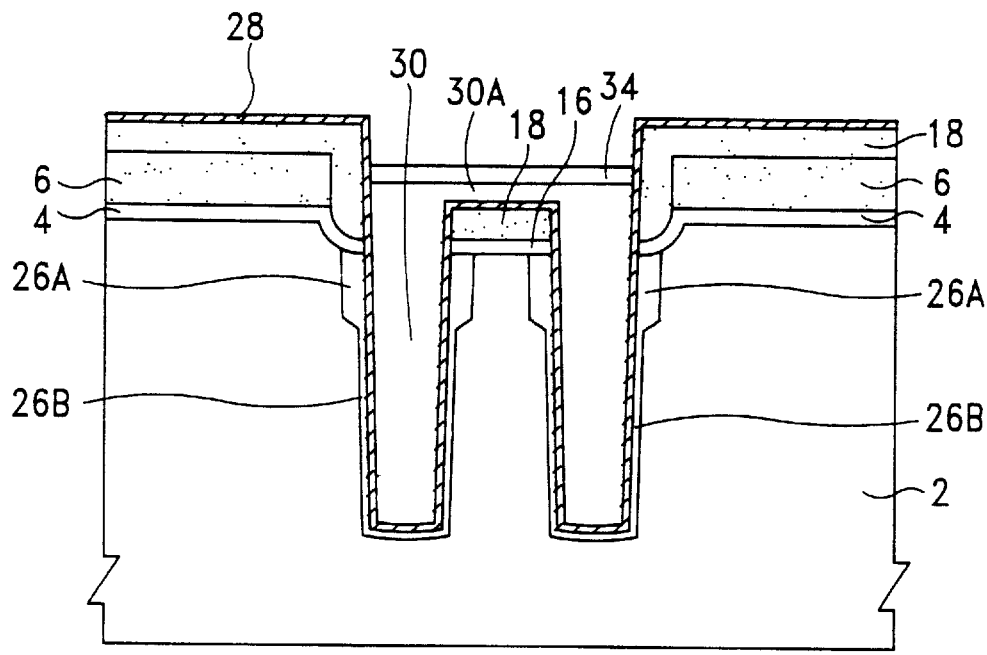
FIG. 13 is a cross-sectional view of a semiconductor wafer illustrating the step of oxidizing the first polysilicon layer according to the present invention.

Successively, a low temperature thermal process within wet oxygen steam ambient is carried out at a temperature of about 800 to 900 degrees centigrade (Please see FIG. 13.) Therefore, an inter-level oxide (ILO) layer 34 having about 1000 to 3000 angstroms in thickness is formed on the surface of the field plate 30A for isolation due to the thermal process. Referring to FIG. 14, the dielectric 28, the second silicon nitride layer 18 formed outside the trenches 24, and the first silicon nitride layer 6 are removed to expose the first silicon oxide layer 4 and top portions of the side walls of the polysilicon layer 30. Typically, the silicon nitride can be removed by using hot phosphorus acid solution. After the step is completed, the field plate 30A, the oxide layer 34 are protruding from the wafer 2. In other words, the surface of the oxide layer 34 is higher than that of the first silicon oxide 4. Next, isolation side-wall spacers 36 are formed on the side walls of the field plate 30A, and the oxide layer 34 for preventing the memory cells from leakage. Further, the side-wall spacers 36 are also refilled into a portion of the recess portion 12 adjacent to the top of the polysilicon 30. This can be achieved by depositing a dielectric layer on the first silicon oxide layer 4, and the oxide layer 34. Then, an isotropical etching is used to etch the dielectric layer, thereby generating the side-wall spacers 36. In this embodiment, the side-wall spacers 36 are composed of silicon nitride.

Figure 15:
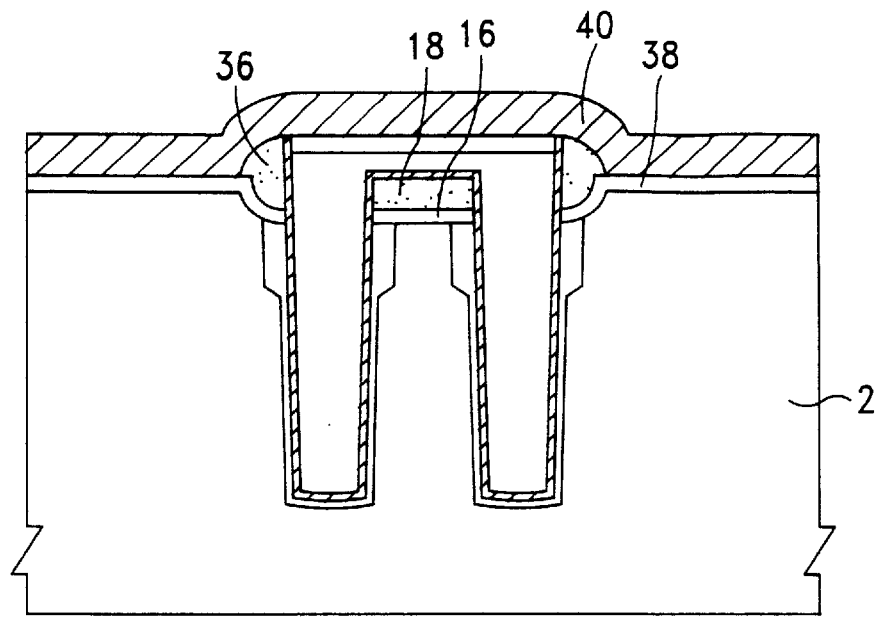
FIG. 15 is a cross-sectional view of a semiconductor wafer illustrating the step of forming a second polysilicon layer according to the present invention.

Turning to FIG. 15, the first silicon oxide 4 that is formed outside the trenches 24 is removed. This can be done by using BOE solution or HF. Next, a silicon oxide layer 38 is reformed on the substrate 2 to act as a gate oxide layer for transistors. Then, a polysilicon layer 40 is formed on the silicon oxide layer 38, the side-wall spacers 36 and the oxide layer 34. The polysilicon layer is formed of doped polysilicon or in-situ polysilicon.

Figure 16:
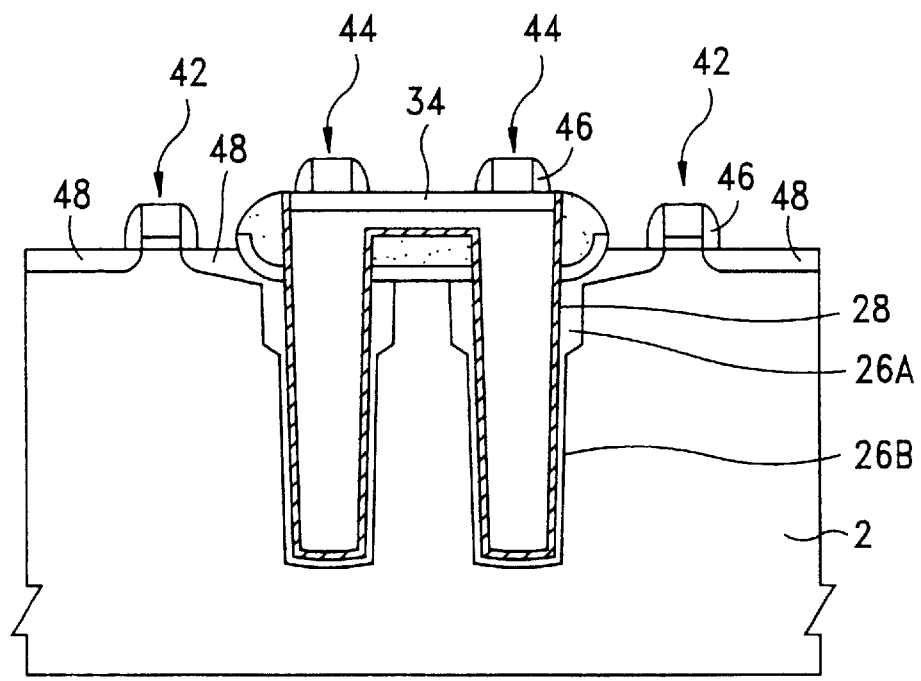
FIG. 16 is a cross-sectional view of a semiconductor wafer illustrating the steps of forming transistors and word lines according to the present invention.

As shown in FIG. 16, lithography and etching processes are used to form the transistors 42, word lines 44. Then, the impurity regions 48 of the transistor 42, the spacers 46 are formed by using well known technology.

As will be understood by persons skilled in the art, the foregoing embodiments of the present invention are illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

The embodiments of the invention in which an exclusive property or privilege is claimed are defined as follows:

1. Trench capacitors with self-aligned field plate formed in a substrate, said substrate having trenches formed therein, said trench capacitors comprising:

a recess region formed adjacent to the top portion of the openings of said trenches and on the top portion between said trenches;

a first isolation layer formed on said substrate and on a surface of said recess region;

a second isolation layer formed on said first isolation layer on a portion of said recess region between said trenches, wherein a bottom surface of said second isolation layer is lower than a top surface of said substrate;

a dielectric layer serving as a capacitor dielectric formed along a surface of said sidewalls of said trenches, said first isolation layer, and on a surface of said second isolation layer;

a sidewall spacer structure formed on a upper portion of said sidewalls of said trenches, which is also refilled in said recess;

a first storage node formed in said substrate surrounding sidewalls of said trenches under said recess;

a second storage node formed in said trenches, and a portion of said second storage node formed over said dielectric layer between said trenches to act as a field plate of said trenches capacitor; and a third isolation layer formed on said field plate.

2. The capacitor of claim 1, wherein said first isolation layer is formed of silicon oxide.

3. The capacitor of claim 1, wherein said second storage node is formed of conductive material.

4. The capacitor of claim 3, wherein said second storage node is formed of doped polysilicon.

5. The capacitor of claim 3, wherein said second storage node is formed of in-situ doped polysilicon.

6. The capacitor of claim 1, wherein said second isolation layer is formed of silicon nitride.

7. The capacitor of claim 1, wherein said third isolation layer is formed of silicon oxide.

8. The capacitor of claim 1, wherein said first storage node is formed of doped ions.

9. The capacitor of claim 1, wherein said dielectric layer is formed of tantalum pentoxide ($Ta_2O_5$).

10. The capacitor of claim 1, wherein said dielectric layer is formed of BST.

11. The capacitor of claim 1, wherein said dielectric layer is formed of PZT.

12. The capacitor of claim 1, wherein said dielectric layer is formed of a triple film of silicon oxide, silicon nitride, silicon oxide.

13. The capacitor of claim 1, wherein said dielectric layer is formed of a double film of silicon nitride, silicon oxide.

* * * * *